(12) United States Patent
Arvin et al.

(10) Patent No.: US 10,957,650 B2
(45) Date of Patent: Mar. 23, 2021

(54) BRIDGE SUPPORT STRUCTURE

(71) Applicant: INTERNATIONAL BUSINESS MACHINES CORPORATION, Armonk, NY (US)

(72) Inventors: Charles L. Arvin, Poughkeepsie, NY (US); Karen P. McLaughlin, Poughkeepsie, NY (US); Brian W. Quinlan, Poughkeepsie, NY (US); Thomas Weiss, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/546,912

(22) Filed: Aug. 21, 2019

(65) Prior Publication Data
US 2021/0057341 A1    Feb. 25, 2021

(51) Int. Cl.
*H01L 23/538* (2006.01)
*H01L 23/00* (2006.01)
(Continued)

(52) U.S. Cl.
CPC .... *H01L 23/5381* (2013.01); *H01L 23/49838* (2013.01); *H01L 23/5386* (2013.01); *H01L 24/06* (2013.01); *H01L 24/16* (2013.01); *H01L 24/17* (2013.01); *H01L 24/81* (2013.01); *H01L 25/0655* (2013.01); *H01L 25/50* (2013.01); *H01L 2224/0603* (2013.01); *H01L 2224/16227* (2013.01); *H01L 2224/1703* (2013.01);
(Continued)

(58) Field of Classification Search
CPC .......... H01L 23/5381; H01L 23/49838; H01L 23/5386; H01L 24/06; H01L 24/16; H01L 24/17; H01L 24/81; H01L 25/50; H01L 2224/0603; H01L 2224/1703; H01L 2224/16277; H01L 2224/81815; H01L 2224/81986; H01L 25/0655
See application file for complete search history.

(56) References Cited

U.S. PATENT DOCUMENTS 5,198,963 A   3/1993  Gupta et al.
7,211,893 B2  5/2007  Alter et al.
(Continued)

FOREIGN PATENT DOCUMENTS

WO    2018058416 A1    4/2018

*Primary Examiner* — Feifei Yeung Lopez
(74) *Attorney, Agent, or Firm* — Law Offices of Ira D, Blecker, P.C.

(57) ABSTRACT

A module including a first semiconductor device, a second semiconductor device, a bridge support structure and a base substrate. The semiconductor devices each having first bonding pads having a first solder joined with the base substrate and the semiconductor devices each having second and third bonding pads joined to second and third bonding pads on the bridge support structure by a second solder and a third solder, respectively, on the second and third bonding pads; the semiconductor devices positioned adjacent to each other such that the bridge support structure joins to both of the semiconductor devices by the second and third solders wherein the third bonding pads are larger than the second bonding pads and the third bonding pads are at a larger pitch than the second bonding pads.

20 Claims, 11 Drawing Sheets

(51) Int. Cl.
*H01L 23/498* (2006.01)
*H01L 25/00* (2006.01)
*H01L 25/065* (2006.01)

(52) U.S. Cl.
CPC .............. *H01L 2224/81815* (2013.01); *H01L 2224/81986* (2013.01)

(56) References Cited

U.S. PATENT DOCUMENTS

| | | | |
|---|---|---|---|
| 7,564,130 B1 * | 7/2009 | Li | H01L 24/14 257/734 |
| 7,969,009 B2 | 6/2011 | Chandrasekaran | |
| 9,543,276 B2 | 1/2017 | Jee et al. | |
| 9,548,264 B2 | 1/2017 | Roy et al. | |
| 9,653,428 B1 * | 5/2017 | Hiner | H01L 25/0655 |
| 9,852,994 B2 | 12/2017 | Haba | |
| 2004/0017008 A1 * | 1/2004 | Ueda | H01L 22/32 257/734 |
| 2010/0327424 A1 * | 12/2010 | Braunisch | H01L 25/0657 257/692 |
| 2013/0168854 A1 * | 7/2013 | Karikalan | H01L 24/73 257/738 |
| 2018/0102311 A1 | 4/2018 | Shih | |

* cited by examiner

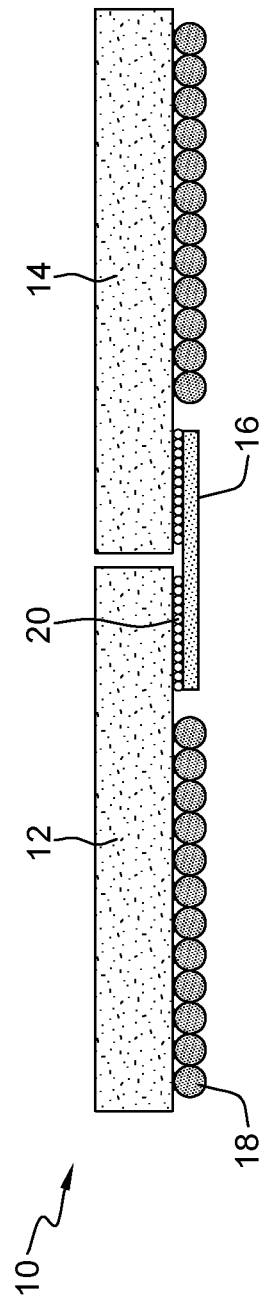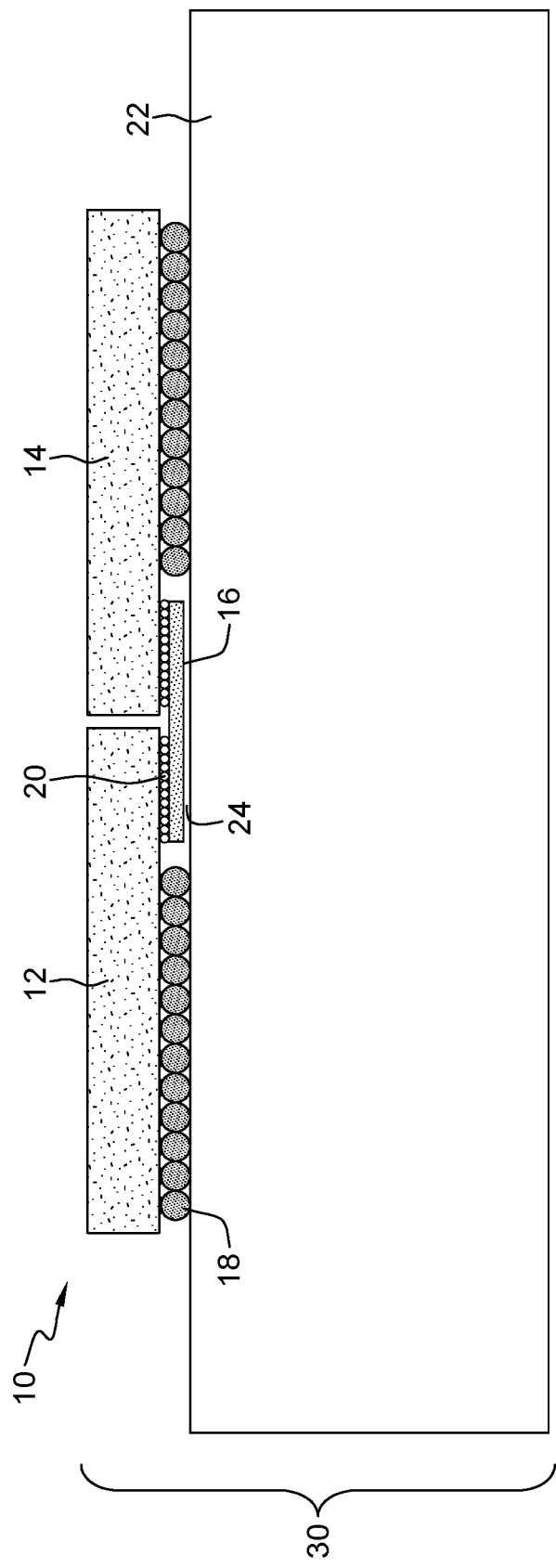

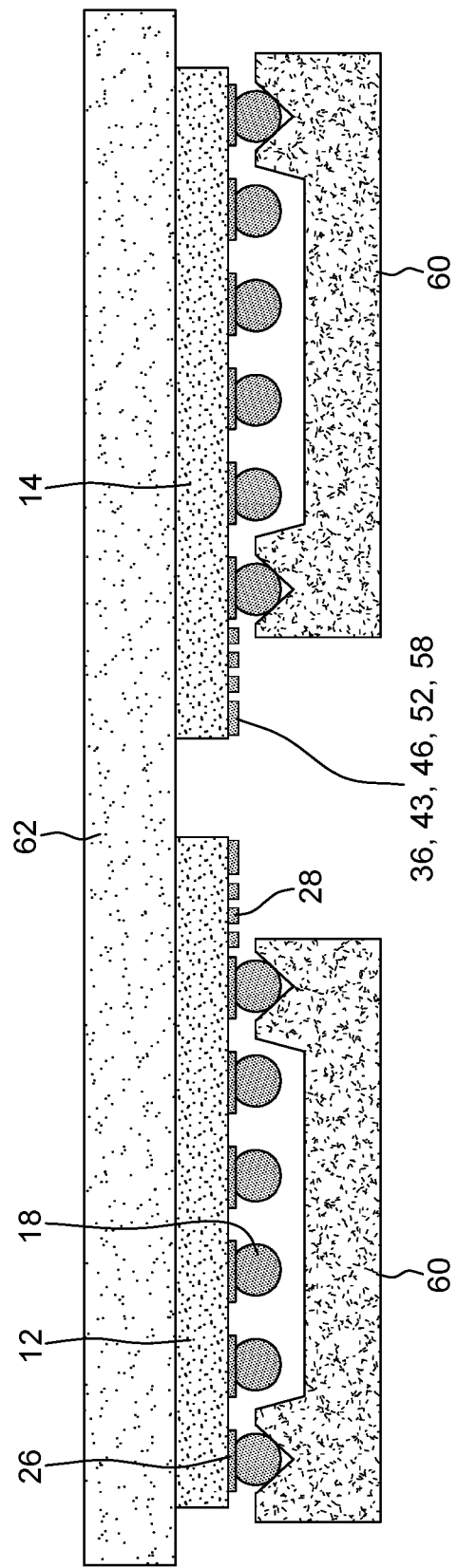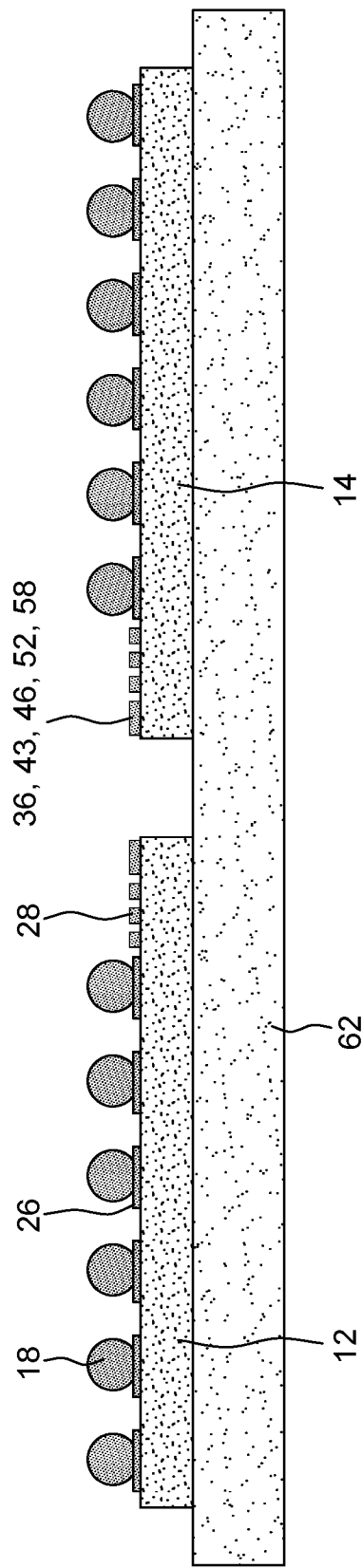

BRIDGE SUPPORT STRUCTURE

BACKGROUND

The present exemplary embodiments pertain to module assemblies and subassemblies and, more particularly, to semiconductor devices that may be connected by bridge support structures so that two semiconductor devices essentially perform as one semiconductor device.

Semiconductor devices, also referred to as chips, have continued to become more complex and grow in size which has resulted in lower yielding semiconductor devices. The semiconductor devices are lower yielding due to defect density staying approximately the same but the die size having a greater chance to be impacted by random defects. In order to reduce yield loss, the semiconductor devices may be split in size but now need to have a greater amount of input/output (I/O) to communicate between semiconductor devices at fast enough rates.

BRIEF SUMMARY

The various advantages and purposes of the exemplary embodiments as described above and hereafter are achieved by providing, according to an aspect of the exemplary embodiments, a module assembly comprising: a first semiconductor device, a second semiconductor device, a bridge support structure and a base substrate; the first semiconductor device and the second semiconductor device each having first bonding pads having a first solder joined with the base substrate and the first semiconductor device and the second semiconductor device each having second and third bonding pads joined to second and third bonding pads on the bridge support structure by a second solder and a third solder, respectively, on the second and third bonding pads; the first semiconductor device and the second semiconductor device positioned adjacent to each other such that the bridge support structure joins to both of the first semiconductor device and the second semiconductor device by the second and third solders wherein the third bonding pads are larger than the second bonding pads and the third bonding pads are at a larger pitch than the second bonding pads.

According to another aspect of the exemplary embodiments, there is provided a module subassembly comprising: a first semiconductor device, a second semiconductor device and a bridge support structure; the first semiconductor device and the second semiconductor device each having first bonding pads having a first solder and the first semiconductor device and the second semiconductor device each having second and third bonding pads joined to second and third bonding pads on the bridge support structure by a second solder and a third solder, respectively, on the second and third bonding pads; the first semiconductor device and the second semiconductor device positioned adjacent to each other such that the bridge support structure joins to both of the first semiconductor device and the second semiconductor device by the second and third solders wherein the third bonding pads are larger than the second bonding pads and the third bonding pads are at a larger pitch than the second bonding pads.

According to a further aspect of the exemplary embodiments, there is provided a method of assembling a module comprising: providing a first semiconductor device, a second semiconductor device and a bridge support structure, the first semiconductor device and the second semiconductor device each having first bonding pads and the first semiconductor device and the second semiconductor device each having second and third bonding pads to join with second and third bonding pads on the bridge support structure wherein the third bonding pads are larger than the second bonding pads and the third bonding pads are at a larger pitch than the second bonding pads; positioning the first semiconductor device and the second semiconductor device such that the second and third bonding pads of the first semiconductor device are precisely spaced apart from the second and third bonding pads of the second semiconductor device so as to match a spacing of the second and third bonding pads on the bridge support structure; applying a first solder to the second bonding pads on the first and second semiconductor devices or the second bonding pads on the bridge support structure; applying a second solder to the third bonding pads on the first and second semiconductor devices or the third bonding pads on the bridge support structure; positioning the bridge support structure so that the second and third bonding pads on the bridge support structure are in alignment with the second and third bonding pads on the first and second semiconductor devices; heating the first and second semiconductor devices and the bridge support structure a first time so as to cause reflow of the third solder to form a first solder connection between the third bonding pads on the first and second semiconductor device and the third bonding pads on the bridge support structure, wherein the third bonding pads on the bridge support structure and the third solder anchors the bridge support structure to the first and second semiconductor devices; and heating the first and second semiconductor devices and the bridge support structure a second time so as to cause reflow of the second solder to form a second solder connection between the second bonding pads on the first and second semiconductor device and the second bonding pads on the bridge support structure.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIG. 1 is a side view of an exemplary embodiment of a module subassembly in which two semiconductor devices are joined by a bridge support structure;

FIG. 2 is a side view of an exemplary embodiment of a module assembly in which two semiconductor devices are joined by a bridge support structure and the two semiconductor devices are joined to a base substrate;

FIGS. 8 to 11 are plan views illustrating other embodiments of a bridge support structure containing fine pitch bonding pads and larger bonding pads in various configurations wherein:

FIG. 8 illustrates that the larger bonding pads may be only on the top and bottom of the smaller bonding pads;

FIG. 9 illustrates that the larger bonding pads may vary in size from an edge of the bridge support structure towards the center of the bridge support structure;

FIG. 10 illustrates that the larger bonding pads may vary in spacing from an edge of the bridge support structure towards the center of the bridge support structure; and FIG. 11 illustrates that the larger bonding pads may be interspersed among the smaller bonding pads.

FIGS. 12A to 12D illustrate a process for fabricating the module assembly wherein:

FIG. 12A illustrates placing the semiconductor devices in fixtures;

FIG. 12B illustrates flipping the semiconductor devices over;

FIG. 12C illustrates joining a bridge support structure to the semiconductor devices; and FIG. 12D illustrates placing the semiconductor devices on a base substrate.

DETAILED DESCRIPTION

Figure 3:
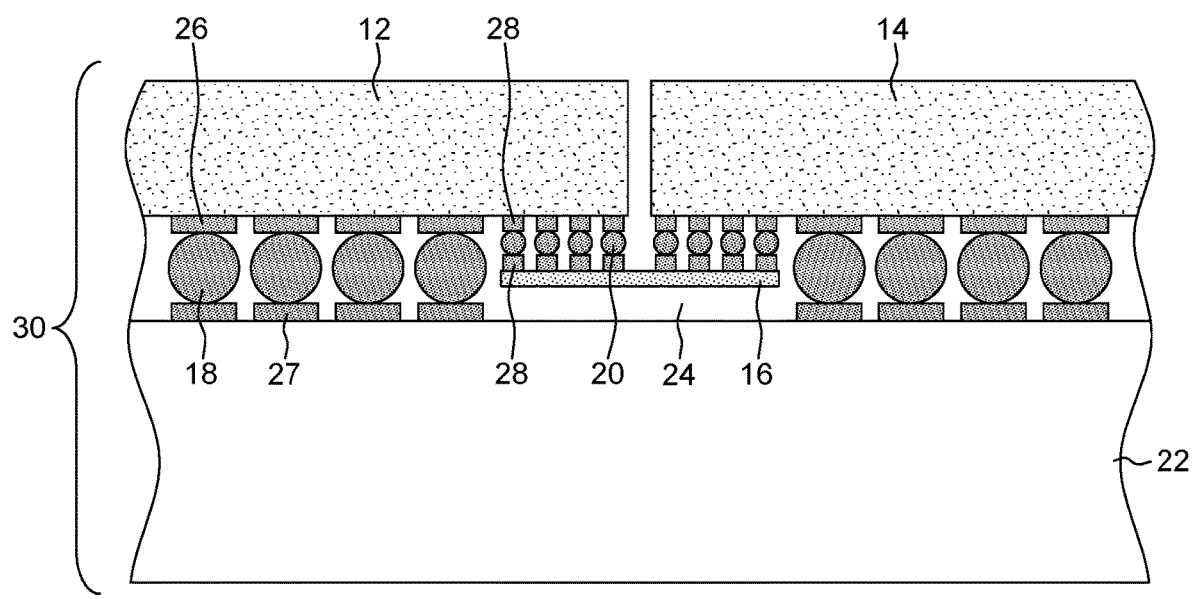
FIG. 3 is an enlarged view of a portion of FIG. 2.

As noted above, the semiconductor devices may be split in size to reduce yield loss. The split semiconductor devices may be connected by a bridge support structure to provide communication between the split semiconductor devices. In order to enable fast communication between the semiconductor devices, wiring dimensions that are achievable in semiconductor fabrication are preferred. A difficulty with such a bridge support structure is that stresses applied to the bridge support structure during cool down after solder reflow make the bridge support structure fragile to assemble and may lead to underfill delamination and/or failure of the solder joints between the chip and a base substrate.

Referring to the Figures in more detail, and particularly referring to FIG. 1, there is illustrated a side view of an exemplary embodiment of a module subassembly 10 in which two semiconductor devices 12, 14 are joined by a bridge support structure 16. The semiconductor devices 12, 14 have bonding pads (not shown) and solder connections 18 that may be used to connect the module subassembly 10 to a base substrate.

The bridge support structure 16 joining the two semiconductor devices 12, 14 may also have bonding pads (not shown) and solder connections 20 to join the bridge support structure 16 to bonding pads (not shown) on each of the semiconductor devices 12, 14.

The bridge support structure 16 may allow the distribution of signal, ground and voltage through the bonding pads (not shown) and solder connections 20 between the semiconductor devices 12, 14.

The bridge support structure 16 may be fabricated from silicon or organic multilayer laminate with high density wiring and fine pitch in order to provide the communication necessary between the semiconductor devices 12, 14. For purposes of illustration and not limitation, the bridge support structure 16 may have a thickness of about 30 to 100 um while the semiconductor devices 12, 14 may have a thickness of about 40 to 800 um.

FIG. 2 illustrates a side view of an exemplary embodiment of a module assembly 30 in which the module subassembly 10 of FIG. 1 may be joined to a base substrate 22.

The base substrate 22 may be, for example, an organic multilayer laminate substrate a glass multilayer laminate or a ceramic multilayer laminate.

The bridge support structure 16 and solder connections are on the same side of semiconductor devices 12, 14 so that the bridge support structure is located between the semiconductor devices 12, 14 and the base substrate 22. Moreover, the bridge support structure 16 is external to the semiconductor devices 12, 14 and the base substrate 22 as clearly shown in FIG. 2. In a preferred exemplary embodiment, there may be a gap 24 between the bridge support structure 16 and the base substrate 22 depending on the number of wiring layers in the bridge support structure 16.

FIG. 3 illustrates an enlarged view of FIG. 2. Shown in further detail in FIG. 3 are the bonding pads 26 on the semiconductor devices 12, 14 for the solder connections 18 of the semiconductor devices 12, 14 and bonding pads 27 on the base substrate 22 for joining the solder connections 18 to the base substrate 22. Also shown in FIG. 3 are the bonding pads 28 on the semiconductor devices 12, 14 and bridge support structure 16 for the solder connections 20 joining the bridge support structure 16 to the semiconductor devices 12, 14. It is preferred that bonding pads 26, 27 and solder connections 18 of the semiconductor devices 12, 14 are larger than the bonding pads 28 and solder connections 20. For example, the bonding pads 26, 27, and corresponding solder connections 18, may be set apart at a 150 um pitch and be 92 um in diameter while the bonding pads 28, and corresponding solder connections 20, may be set apart at a 10 to 50 um pitch and be 5 to 30 um in diameter.

Figure 4:
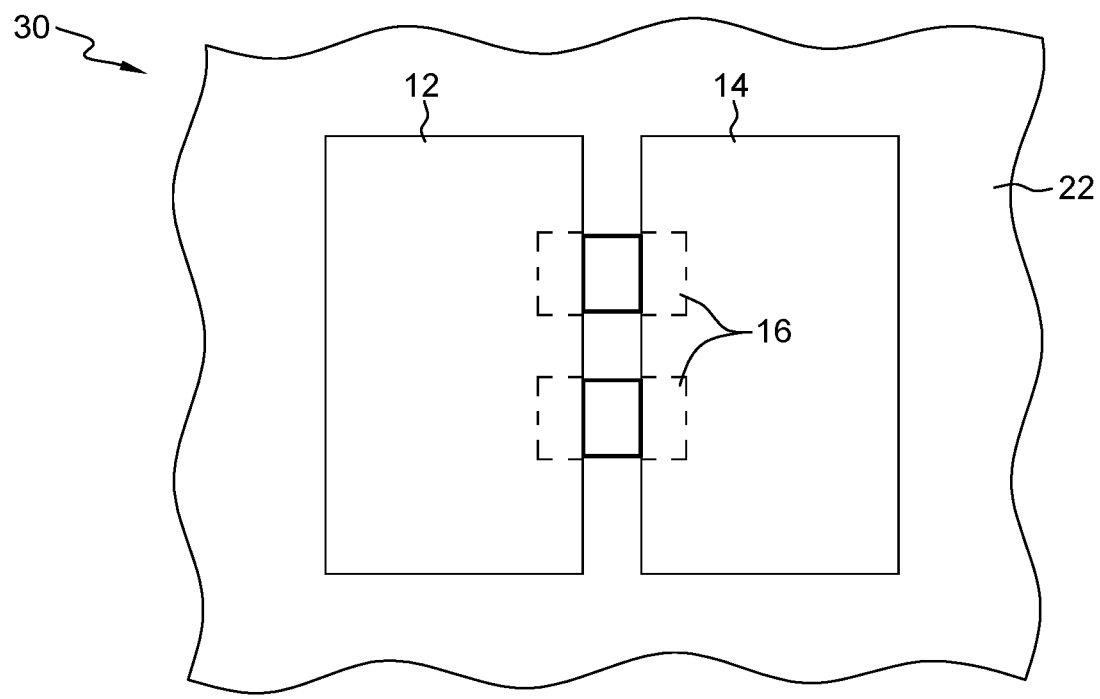
FIG. 4 is a plan view of a module assembly having a plurality of bridge support structures.

Referring now to FIG. 4, there is illustrated a plan view of the module assembly 30 having a plurality of bridge support structures 16. As can be seen, the bridge support structures 16 straddle the space between the semiconductor devices 12, 14 to enable signal, power and voltage between the semiconductor devices 12, 14. There are many keep out rules adjacent to the edges of the semiconductor devices 12, 14 which allow the placement of the bridge support structures 16 without taking away valuable device real estate essential to the workings of the semiconductor devices 12, 14.

Figure 5:
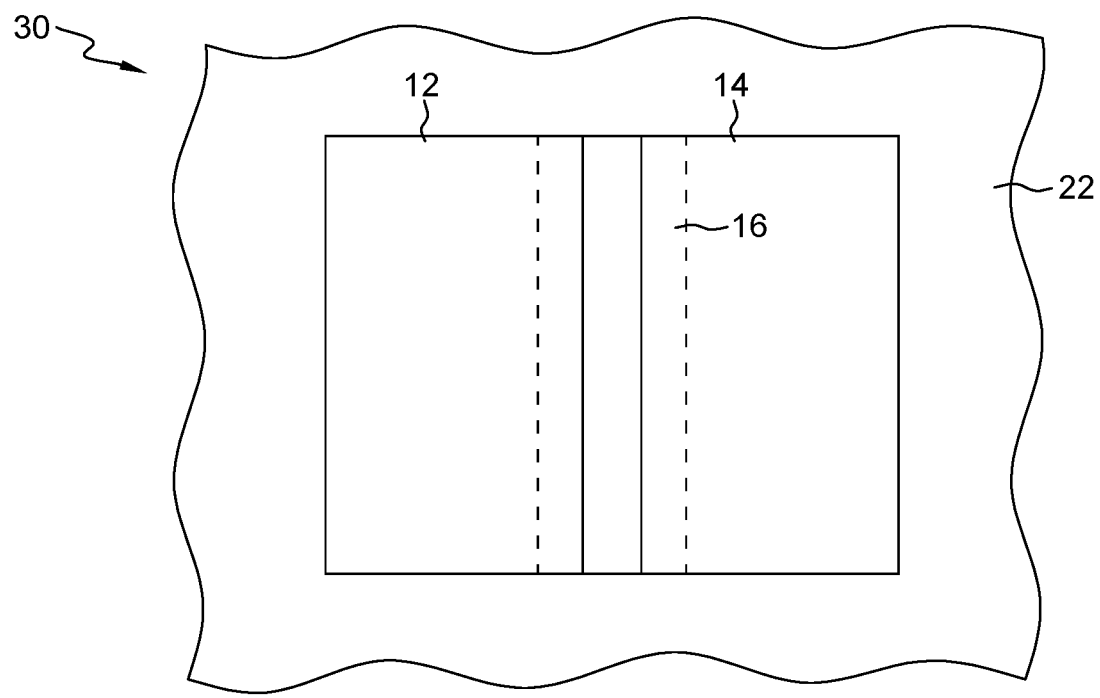
FIG. 5 is a plan view of a module assembly having one bridge support structure

FIG. 5 illustrates a plan view of the module assembly 30 similar to FIG. 4 but having only one bridge support structure 16 that may extend the full length of the semiconductor devices 12, 14.

Figure 6:
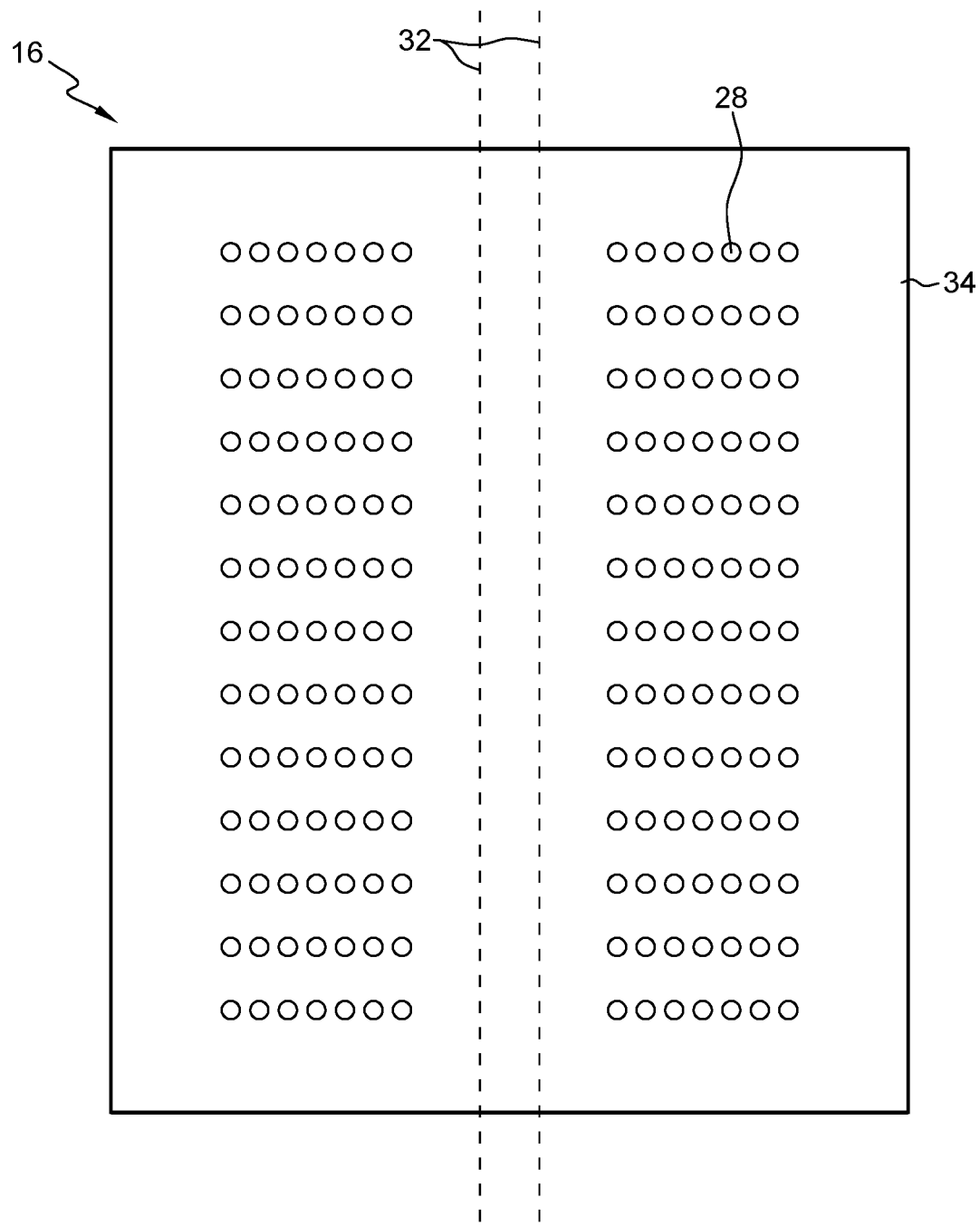
FIG. 6 is a plan view of an embodiment of a bridge support structure illustrating the bonding pads of the bridge support structure that may attach to the two semiconductor devices.

FIG. 6 is a plan view of an embodiment of the bridge support structure 16 illustrating the bonding pads 28 on surface 34 of the bridge support structure 16 that may attach to matching bonding pads 28 on the two semiconductor devices 12, 14. Surface 34 is the top surface of bridge support structure 16 illustrated in FIG. 3. Again, the bonding pads have a fine pitch of 10 to 50 um and be 5 to 30 um in diameter. Dashed lines 32 indicate the edges of the semiconductor devices 12, 14

Figure 7:
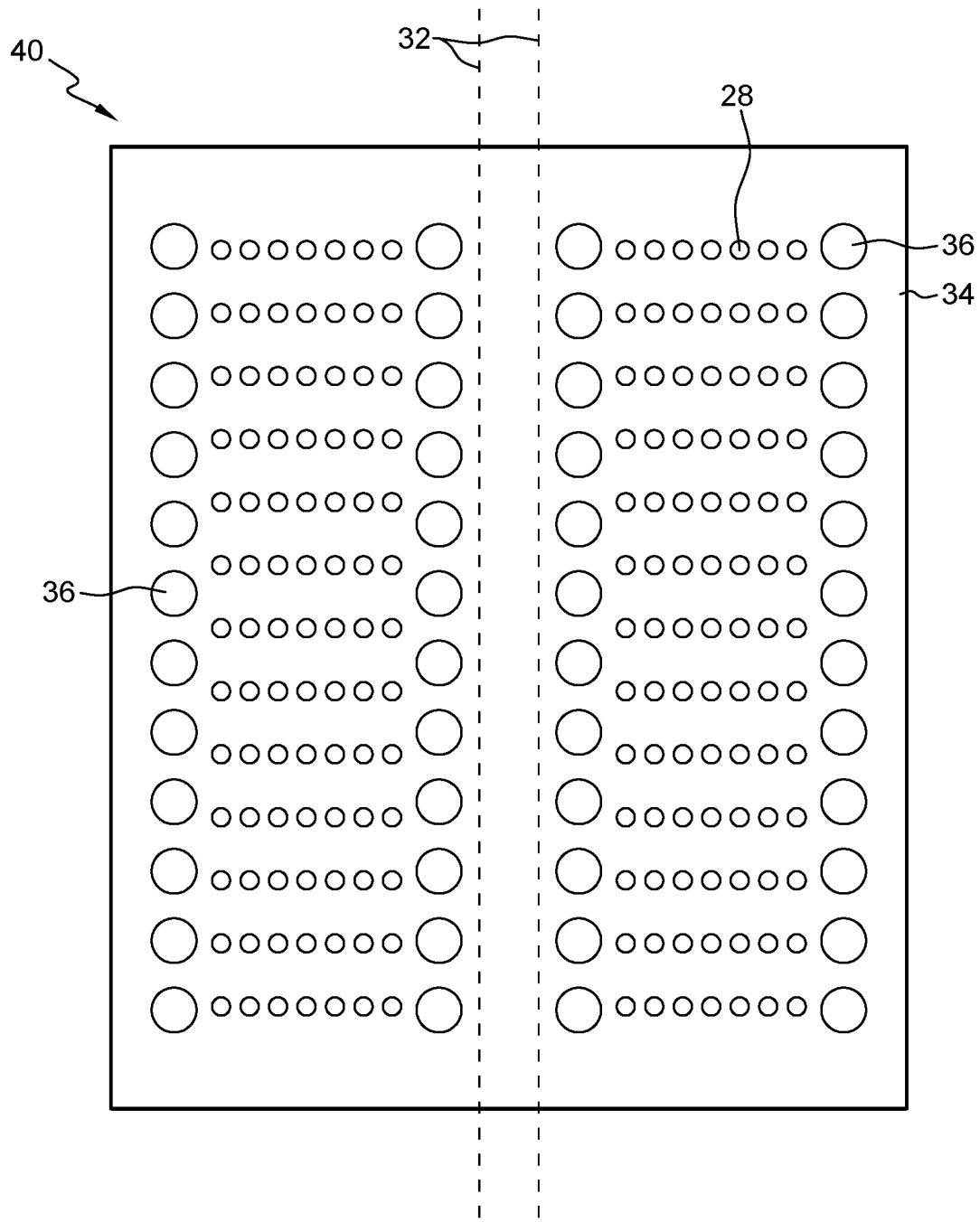
FIG. 7 is a plan view of another embodiment of a bridge support structure containing fine pitch bonding pads and larger bonding pads of the bridge support structure that may attach to the two semiconductor devices.

FIG. 7 is a plan view of another embodiment of a bridge support structure 40 illustrating the fine pitch bonding pads 28 on surface 34 of the bridge support structure 40 that may attach to matching bonding pads 28 on the two semiconductor devices 12, 14. In addition, the bridge support structure 40 includes larger bonding pads 36 adjacent to the arrays of fine pitch bonding pads 28 which may perform an electrical function such as for ground reference. However, a more important function for these larger bonding pads 36 may be as anchoring pads which anchor the bridge support structure 40 to the semiconductor devices 12, 14 to hold the bridge support structure 40 in place and relieve stresses on the smaller bonding pads 28. The semiconductor devices 12, 14 may have matching larger bonding pads 36. For purposes of illustration and not limitation, the larger bonding pads 36 may be at a 150 um pitch and 92 um in diameter. In one exemplary embodiment, the larger bonding pads 36 may be similar in pitch and size to bonding pads 26 on the semiconductor devices 12, 14.

FIGS. 8 to 11 are plan views illustrating other embodiments of a bridge support structure containing fine pitch bonding pads 28 and larger bonding pads in various configurations. In all of FIGS. 8 to 11, the larger bonding pads may function as anchoring pads which anchor the bridge support structure to the semiconductor devices 12, 14 to hold the bridge support structure in place and relieve stresses on the smaller bonding pads 28.

While important functions of the larger bonding pads are to anchor the bridge support structure to the semiconductor devices 12, 14 and to self-align the bridge support structure to the semiconductor devices 12, 14, the larger bonding pads may also be used for power and/or ground connections.

Figure 8:
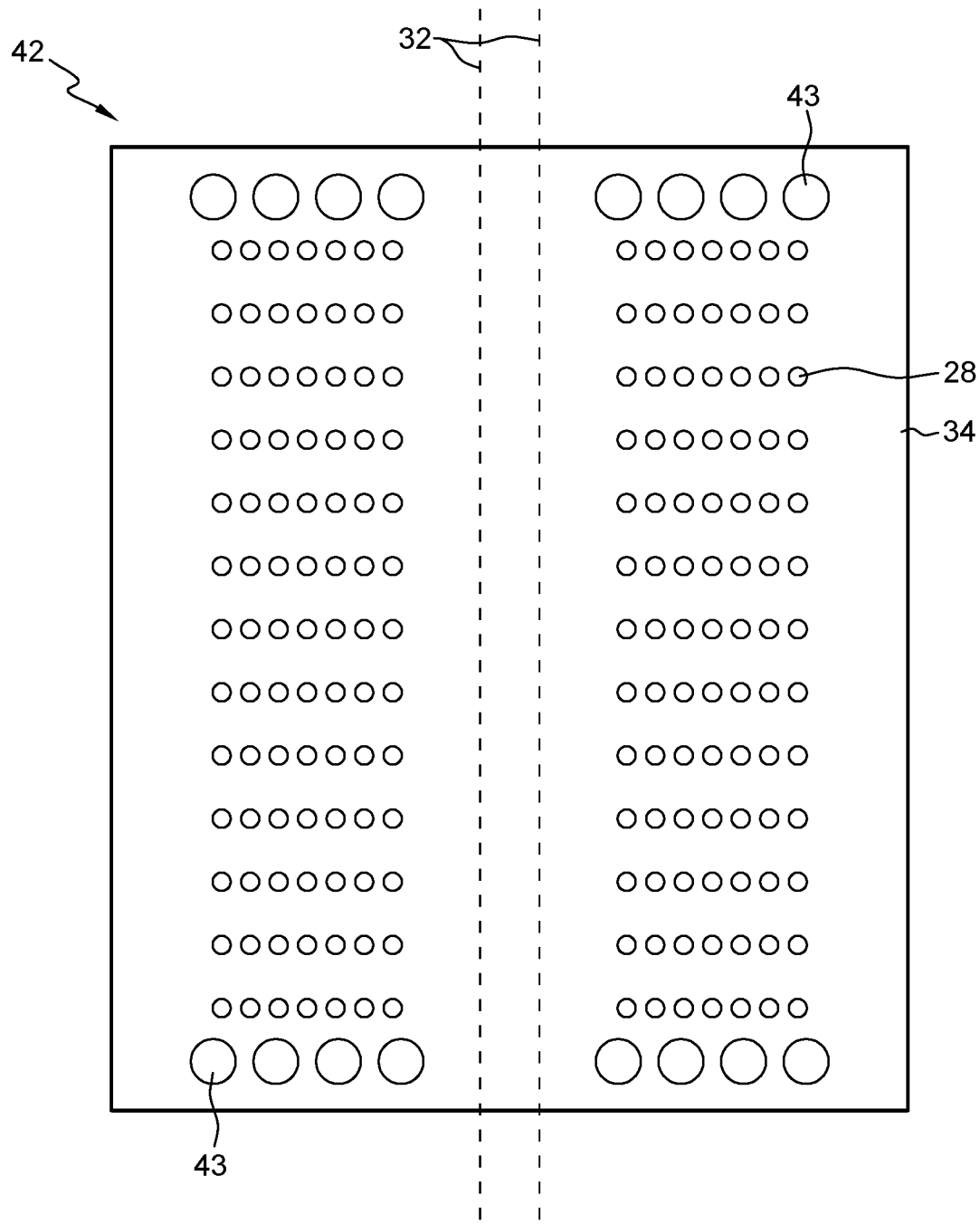

In FIG. 8, the larger bonding pads 43 may be only on the top and bottom of the arrays of the smaller bonding pads 28. The larger bonding pads 43 may be at a 100-150 um pitch and 92 um in diameter.

Figure 9:
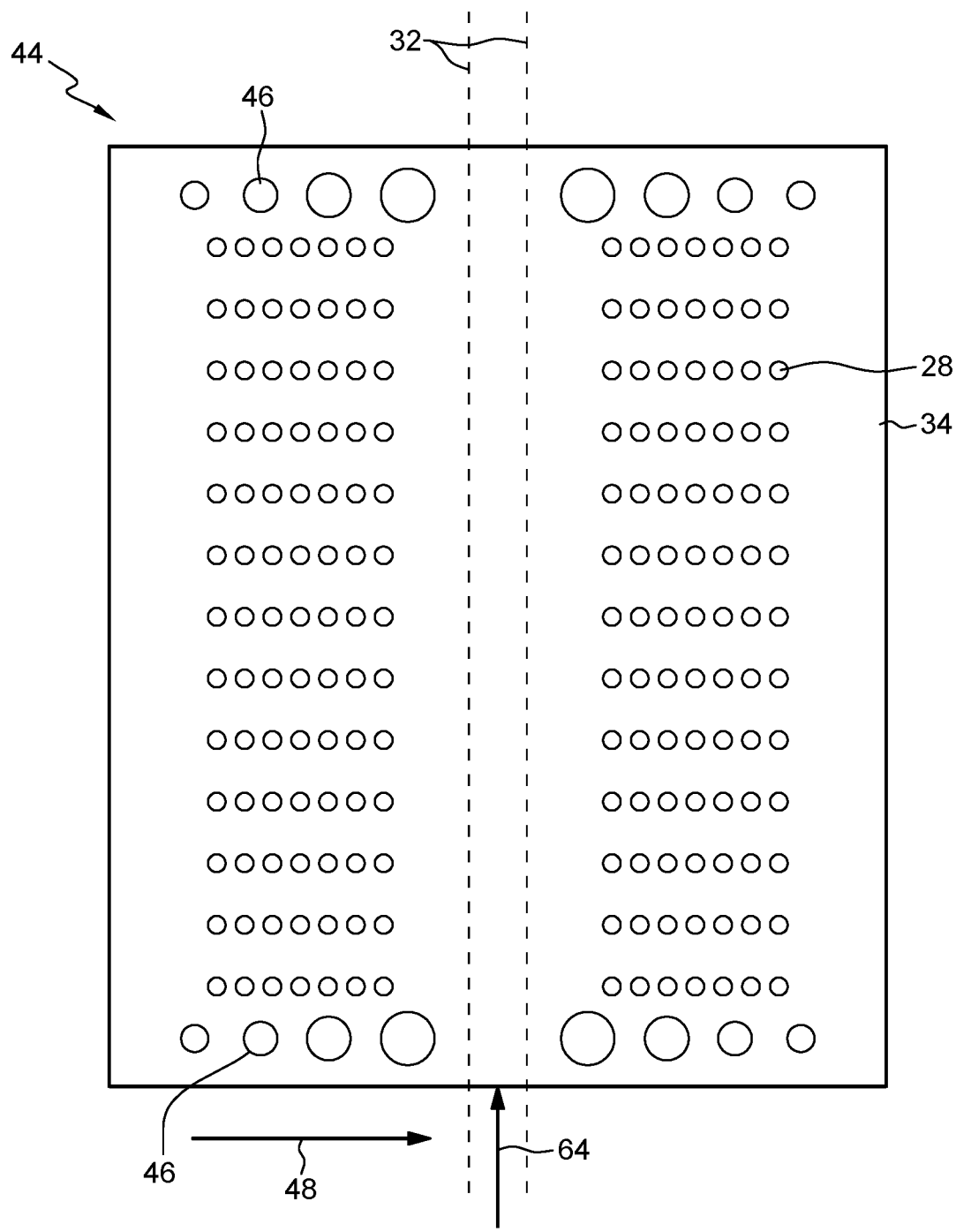

In FIG. 9, the larger bonding pads 46 in bridge support structure 44 may be arranged only above and below the arrays of the smaller bonding pads 28. And in addition, the larger bonding pads 46 may vary in size, and increasing in size, from an edge of the bridge support structure 44 towards the center 64 of the bridge support structure 44, as indicated by arrow 48. In one exemplary embodiment, the larger bonding pads 46 may vary in size and pitch from 50 um pitch and 30 um in diameter. to 150 um pitch and 92 um in diameter. The variation in size may be desirable to compensate for greater expansion of the base substrate 22 near the edges of the base substrate 22. The variation in size may change with the material of the base substrate 22.

Figure 10:
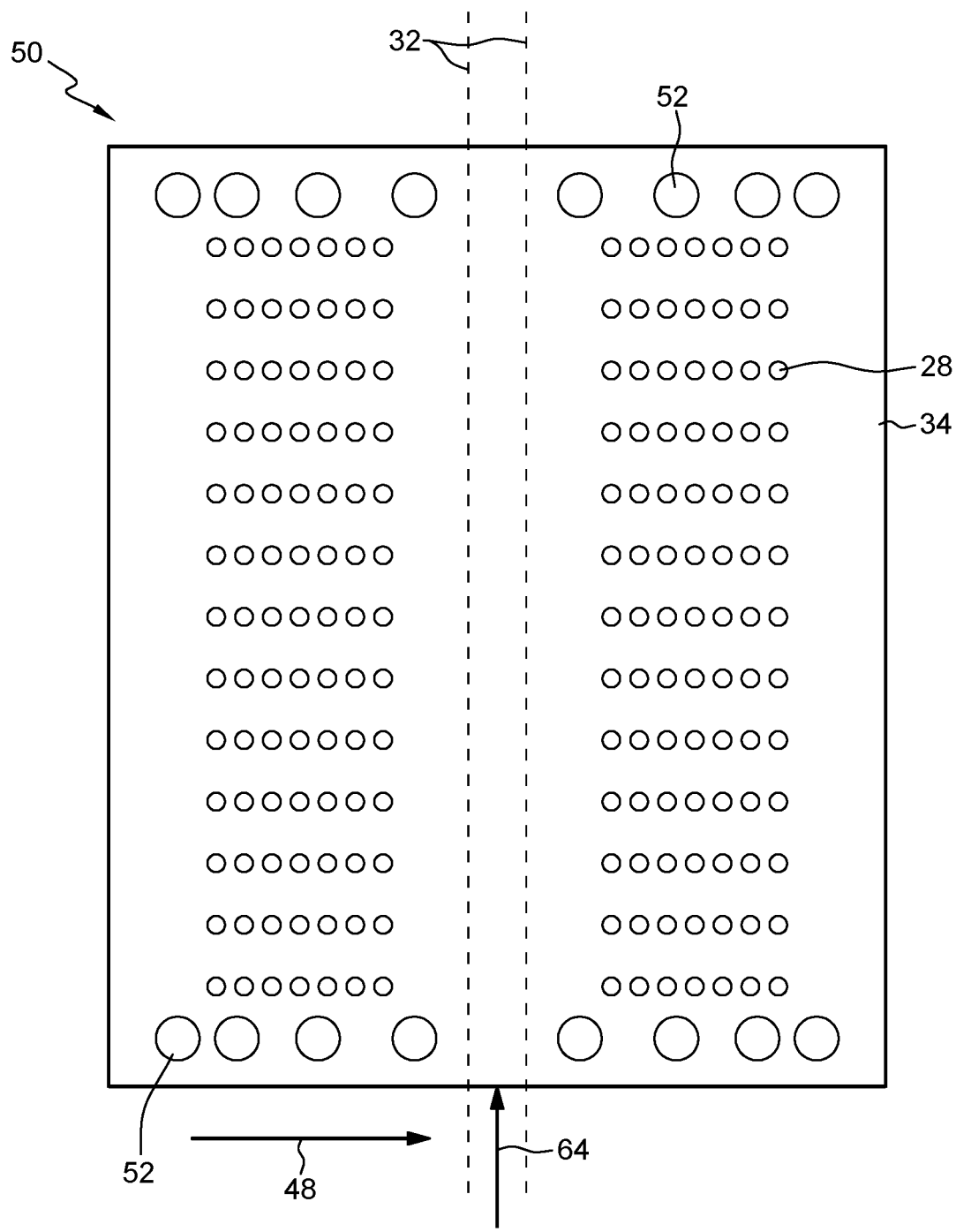

In FIG. 10, bridge support structure 50 illustrates the larger bonding pads 52 may be arranged only above and below the arrays of the smaller bonding pads 28. And in addition, the larger bonding pads 52 may vary in spacing, and increase in spacing, from an edge of the bridge support structure 50 towards the center 64 of the bridge support structure 50, as indicated by arrow 54. In one exemplary embodiment, the larger bonding pads 52 may be 50 um to 92 um in diameter and vary in pitch from 75 um to 150 um. The variation in spacing may be desirable to compensate for greater expansion of the base substrate near the edges of the base substrate. The variation in spacing may change with the material of the base substrate 22.

Figure 11:
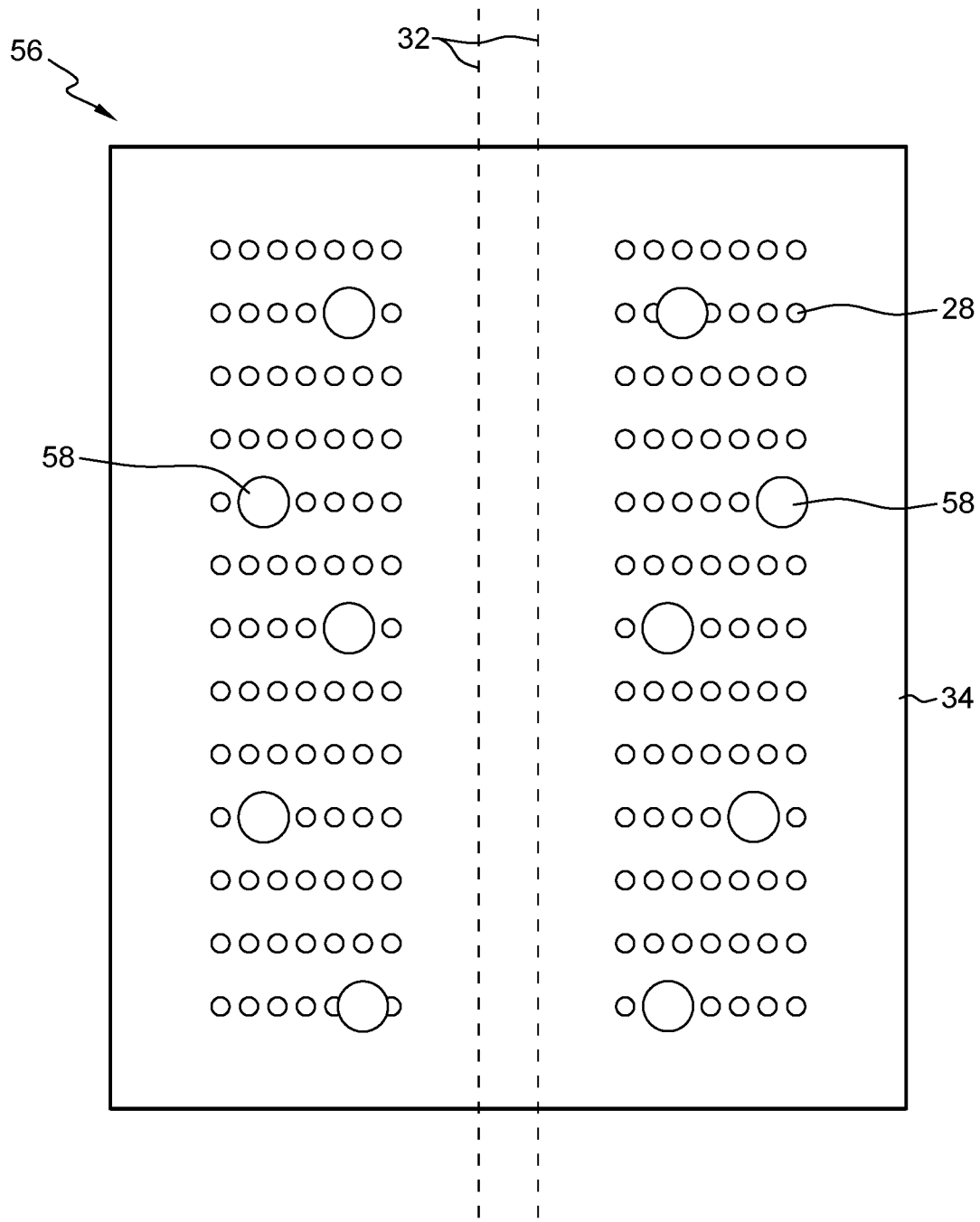

In FIG. 11, bridge support structure 56 illustrates the larger bonding pads 58 may be interspersed among the smaller bonding pads 28.

All of FIGS. 7 to 11 have in common the presence of fine pitch bonding pads 28 and larger bonding pads 36, 43, 46, 52, 58 to form a mix of bonding pads of different pitches and sizes. While FIGS. 7 to 11 illustrate different configurations of fine pitch bonding pads 28 and larger bonding pads 36, 43, 46, 52, 58, it is within the scope of the exemplary embodiments to combine any of the configurations of FIGS. 7 to 11, or parts thereof, to form different configurations of fine pitch bonding pads 28 and larger bonding pads 36, 43, 46, 52, 58 other than those shown in FIGS. 7 to 11, so long as there is a mix of bonding pads of different pitches and sizes.

Figure 12C:
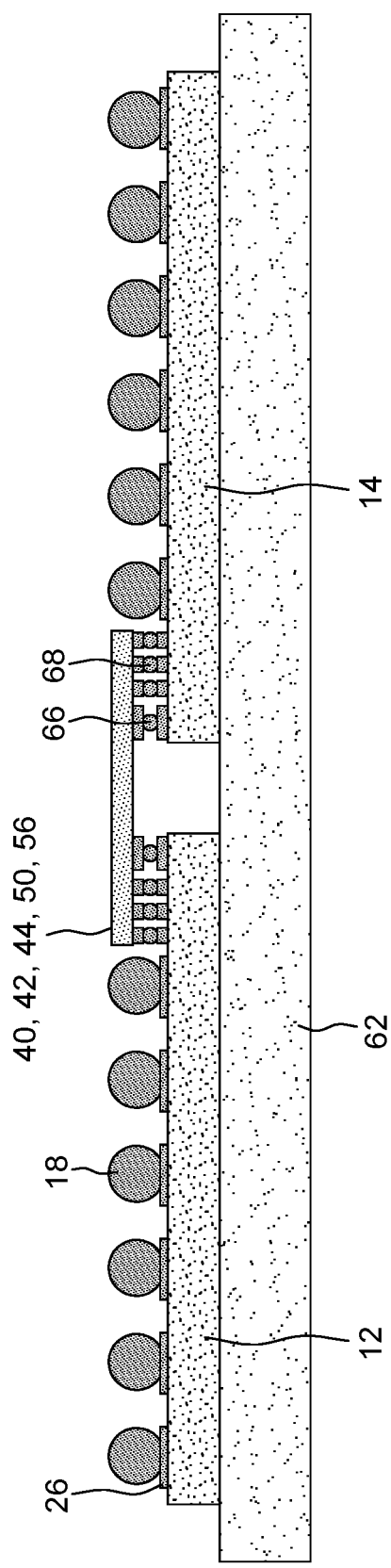

FIGS. 12A to 12D illustrate a process for fabricating the various embodiments of the module assembly 30. In FIG. 12A, the semiconductor devices 12, 14 are placed in fixtures 60 so that the semiconductor devices 12, 14 may be accurately located with respect to each other. Each of the semiconductor devices 12, 14 may have been previously processed to have to bonding pads 26 and solder connections 18, such as solder balls. To assist in the subsequent handling of the semiconductor devices 12, 14, a stiffener 62 may be temporarily affixed by adhesive, for example, to the back side (non-active side) of the semiconductor devices 12, 14. FIG. 12A further illustrates the smaller bonding pads 28 and larger bonding pads 36, 43, 46, 52, 58 on the semiconductor devices 12, 14.

FIG. 12B illustrates flipping the semiconductor devices 12, 14 over so that the smaller bonding pads 28 on the semiconductor devices 12, 14 and larger bonding pads 36, 43, 46, 52, 58 are in a better position for joining with the bridge support structure 40, 42, 44, 50, 56.

FIG. 12C illustrates joining the bridge support structure 40, 42, 44, 50, 56 to the semiconductor devices 12, 14 by reflowing the solder connections 66 between the larger bonding pads 36, 43, 46, 52, 58 on the bridge support structure 40, 42, 44, 50, 56 and the semiconductor devices 12, 14. In a subsequent step, the solder connections 68 between the smaller bonding pads 28 on the bridge support structure 40, 42, 44, 50, 56 and the semiconductor devices 12, 14 would be reflowed.

Figure 12D:
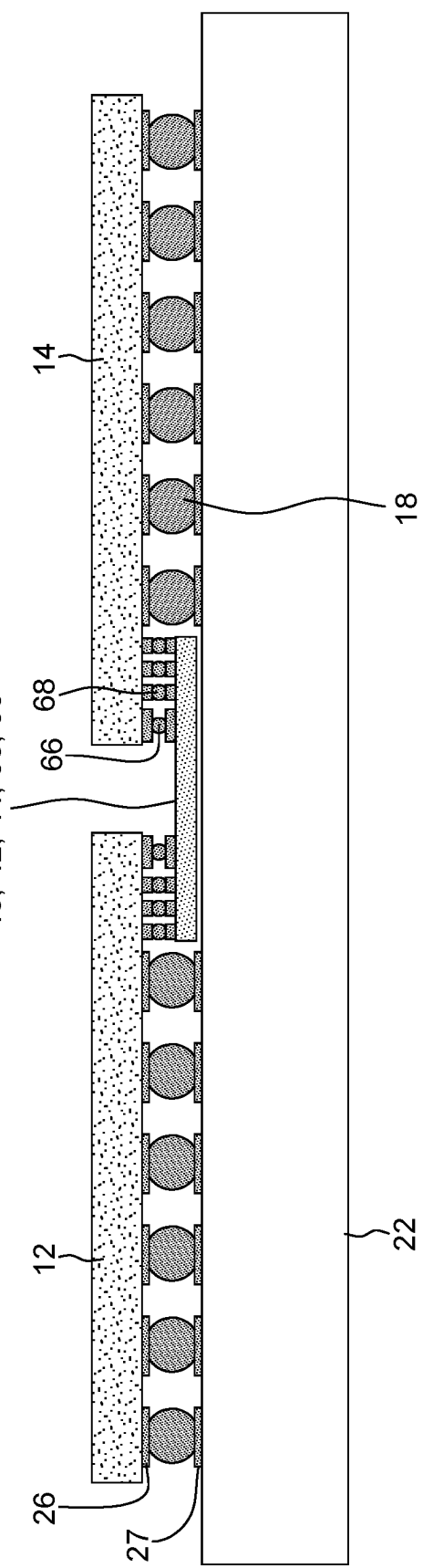

FIG. 12D illustrates placing the semiconductor devices 12, 14 on a base substrate 22. The stiffener 62 may be removed. The solder connections 18 may be reflowed to join the semiconductor devices 12, 14 to the base substrate 22.

In the embodiments where larger bonding pads 36, 43, 46, 52, 58 on the bridge support structure 40, 42, 44, 50, 56 may be used as illustrated in FIGS. 7 to 11, it is preferred to utilize a solder hierarchy to aid in alignment by purposely offsetting the large bonding pads with low temp solder to self-align the bridge support structure 40, 42, 44, 50, 56 to the semiconductor devices 12, 14. Higher melt solder may be utilized on the small bonding pads 28 that melt and form an all intermetallic joint that will not re-melt during joining of the semiconductor devices 12, 14 to base substrate 22.

In one exemplary embodiment, to control the solder height delta between the joined larger bonding pads 36, 43, 46, 52, 58 and small bonding pads 28 on the bridge support structure 40, 42, 44, 50, 56, thermal compression bonding may be used to control the solder height delta during joining of the bridge support structure 40, 42, 44, 50, 56 to the semiconductor devices 12, 14.

The bonding pads 26, 27 of the semiconductor devices 12, 14, the larger bonding pads 36, 43, 46, 52, 58 and the small bonding pads 28 may be nickel or other suitable metal. In an alternative embodiment, the bonding pads 28 on the bridge support structure 40, 42, 44, 50, 56 side or the semiconductor devices 12, 14 side may be copper while the opposed bonding pads may be nickel. In this alternative embodiment, there may be no solder on the copper bonding pads.

The solder for the large bonding pads 36, 43, 46, 52, 58 may be a lead-free, lower melting solder such as Sn/Bi solder (85 weight percent Sn or more, remainder Bi) that forms sufficient liquid to join the large anchoring pads 36, 43, 46, 52, 58 to the semiconductor devices 12, 14 without causing the solder on the smaller bonding pads 28 and the bonding pads 26, 27 of the semiconductor devices 12, 14 to melt. The lead-free lower melting solder may form an intermetallic with the nickel bonding pad to raise its melting temperature to around 280° C. so as to withstand remelting during joining of the smaller solder connections between the bridge support structure 40, 42, 44, 50, 56 and the semiconductor devices 12, 14 and joining of the solder connections 18 between the semiconductor devices 12, 14 and the base substrate 22. A suitable solder for these latter solder connections may be a lead-free, higher melting solder such as, but not limited to, SAC 305 (96.5% Sn, 3% Ag, 0.5% Cu, in weight percent).

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A module assembly comprising:
   a first semiconductor device, a second semiconductor device, a bridge support structure and a base substrate;
   the first semiconductor device and the second semiconductor device each having first bonding pads having a first solder joined with the base substrate and the first semiconductor device and the second semiconductor device each having second and third bonding pads joined to second and third bonding pads on the bridge support structure by a second solder and a third solder, respectively, on the second and third bonding pads wherein a composition of the second solder is different from a composition of the third solder;
   the first semiconductor device and the second semiconductor device positioned adjacent to each other such that the bridge support structure joins to both of the first semiconductor device and the second semiconductor device by the second and third solders wherein the third bonding pads are larger than the second bonding pads and the third bonding pads are at a larger pitch than the second bonding pads.

2. The module assembly of claim 1 wherein the bridge support structure is external to the first semiconductor device, the second semiconductor device and the base substrate.

3. The module assembly of claim 1 wherein the bridge support structure maintains a gap between the bridge support structure and the base substrate.

4. The module assembly of claim 1 wherein the third bonding pads are the same size as the first bonding pads.

5. The module assembly of claim 1 wherein the third bonding pads increase in spacing in a direction toward a center of the bridge support structure.

6. The module assembly of claim 1 wherein the third bonding pads increase in size in a direction toward a center of the bridge support structure.

7. The module assembly of claim 1 wherein the third bonding pads are interspersed among the second bonding pads so as to form an array of bonding pads of mixed pitch and size.

8. The module assembly of claim 1 wherein the second bonding pads and the third bonding pads form an array of bonding pads of mixed pitch and size.

9. The module assembly of claim 1 wherein the first bonding pads, the second bonding pads and the third bonding pads are situated on the same side of the first semiconductor device and the second semiconductor device.

10. The module assembly of claim 1 wherein the bridge support structure comprises an organic multilayer substrate, a glass multilayer substrate or a ceramic laminate substrate.

11. A module subassembly comprising:
    a first semiconductor device, a second semiconductor device and a bridge support structure;
    the first semiconductor device and the second semiconductor device each having first bonding pads having a first solder and the first semiconductor device and the second semiconductor device each having second and third bonding pads joined to second and third bonding pads on the bridge support structure by a second solder and a third solder, respectively, on the second and third bonding pads wherein a composition of the second solder is different from a composition of the third solder;
    the first semiconductor device and the second semiconductor device positioned adjacent to each other such that the bridge support structure joins to both of the first semiconductor device and the second semiconductor device by the second and third solders wherein the third bonding pads are larger than the second bonding pads and the third bonding pads are at a larger pitch than the second bonding pads.

12. The module subassembly of claim 11 wherein the bridge support structure is external to the first semiconductor device and the second semiconductor device.

13. The module subassembly of claim 11 wherein the third bonding pads are the same size as the first bonding pads.

14. The module subassembly of claim 11 wherein the third bonding pads increase in spacing in a direction toward a center of the bridge support structure.

15. The module subassembly of claim 11 wherein the third bonding pads increase in size in a direction toward a center of the bridge support structure.

16. The module subassembly of claim 11 wherein the third bonding pads are interspersed among the second bonding pads so as to form an array of bonding pads of mixed pitch and size.

17. The module subassembly of claim 11 wherein the second bonding pads and the third bonding pads form an array of bonding pads of mixed pitch and size.

18. The module subassembly of claim 11 wherein the first bonding pads, the second bonding pads and the third bonding pads are situated on the same side of the first semiconductor device and the second semiconductor device.

19. The module subassembly of claim 11 wherein the bridge support structure comprises silicon.

20. A method of assembling a module comprising:
    providing a first semiconductor device, a second semiconductor device and a bridge support structure, the first semiconductor device and the second semiconductor device each having first bonding pads and the first semiconductor device and the second semiconductor device each having second and third bonding pads to join with second and third bonding pads on the bridge support structure wherein the third bonding pads are larger than the second bonding pads and the third bonding pads are at a larger pitch than the second bonding pads;
    positioning the first semiconductor device and the second semiconductor device such that the second and third bonding pads of the first semiconductor device are precisely spaced apart from the second and third bonding pads of the second semiconductor device so as to match a spacing of the second and third bonding pads on the bridge support structure;
    applying a first solder to the second bonding pads on the first and second semiconductor devices or the second bonding pads on the bridge support structure;

applying a second solder to the third bonding pads on the first and second semiconductor devices or the third bonding pads on the bridge support structure;

positioning the bridge support structure so that the second and third bonding pads on the bridge support structure are in alignment with the second and third bonding pads on the first and second semiconductor devices;

heating the first and second semiconductor devices and the bridge support structure a first time so as to cause reflow of the third solder to form a first solder connection between the third bonding pads on the first and second semiconductor device and the third bonding pads on the bridge support structure, wherein the third bonding pads on the bridge support structure and the third solder anchors the bridge support structure to the first and second semiconductor devices; and heating the first and second semiconductor devices and the bridge support structure a second time so as to cause reflow of the second solder to form a second solder connection between the second bonding pads on the first and second semiconductor device and the second bonding pads on the bridge support structure wherein a composition of the second solder is different from a composition of the third solder.

* * * * *